United States Patent
Chou et al.

(10) Patent No.: US 9,825,388 B2
(45) Date of Patent: Nov. 21, 2017

(54) LAYOUT METHOD, ELECTRONIC DEVICE AND CONNECTOR

(71) Applicant: NOVATEK MICROELECTRONICS CORP., HsinChu (TW)

(72) Inventors: Chun-Yi Chou, Hsinchu (TW); Yu-Chang Pai, Hsinchu (TW); Teng-Yang Tan, Hsinchu (TW); Shih-Wei Tseng, Hsinchu (TW)

(73) Assignee: NOVATEK MICROELECTRONICS CORP., Hsinchu (TW)

( * ) Notice: Subject to any disclaimer, the term of this patent is extended or adjusted under 35 U.S.C. 154(b) by 339 days.

(21) Appl. No.: 14/457,469

(22) Filed: Aug. 12, 2014

(65) Prior Publication Data

US 2015/0085452 A1 Mar. 26, 2015

(30) Foreign Application Priority Data

Sep. 24, 2013 (TW) .............................. 102134351 A

(51) Int. Cl.
*H05K 1/11* (2006.01)
*H01R 12/79* (2011.01)
(Continued)

(52) U.S. Cl.
CPC ......... *H01R 12/79* (2013.01); *H01R 13/6471* (2013.01); *H05K 1/189* (2013.01);
(Continued)

(58) Field of Classification Search
CPC .......... H05K 1/14; H05K 1/142; H05K 1/147; H05K 3/308; H01R 12/727; H01R 12/722; H01R 12/725; H01R 12/732; H01B 7/0823; H01B 7/0838; H01B 7/0846; H01P 5/12; H01P 3/003; H01P 3/026; H01P 3/08

USPC ........ 361/784, 785, 791, 792, 803; 174/254, 174/261, 117 F, 117 FF; 333/116, 128, 333/238

See application file for complete search history.

(56) References Cited

U.S. PATENT DOCUMENTS

| | | | | |
|---|---|---|---|---|
| 7,889,512 | B1 * | 2/2011 | Borsch | H05K 1/181 361/763 |
| 2004/0208211 | A1 * | 10/2004 | Maruyama | H01S 5/02212 372/38.1 |
| 2010/0210142 | A1 * | 8/2010 | McGrath | H01R 12/594 439/620.22 |

FOREIGN PATENT DOCUMENTS

CN 101276231 A 10/2008
CN 102348052 A 2/2012

OTHER PUBLICATIONS

Chinese Office Action dated May 27, 2016.

* cited by examiner

*Primary Examiner* — Binh Tran
(74) *Attorney, Agent, or Firm* — Rabin & Berdo, P.C.

(57) ABSTRACT

A layout method applied to a connector is provided. The connector is electrically connected between a flexible printed circuit (FPC) and a printed circuit board (PCB). The FPC includes M pairs of differential lines and X shield lines. The PCB includes M pairs of differential lines and Z shield lines. The layout method includes following steps. Firstly, M pairs of conductive lines are disposed on the connector. The M conductive lines are correspondingly electrically connected to the M differential lines of the FPC and the M differential lines of the PCB. Then, Y conductive lines are disposed on the connector, wherein Y is smaller than X. Furthermore, at least one of the Y conductive lines is electrically connected to at least one of the X shield lines and at least one of the Z shield lines.

8 Claims, 3 Drawing Sheets

(51) Int. Cl.
H01R 13/6471 (2011.01)
H05K 1/18 (2006.01)
*H05K 1/14* (2006.01)
*H05K 3/30* (2006.01)
*H01R 12/72* (2011.01)
*H01P 5/12* (2006.01)
*H01B 7/08* (2006.01)
*H05K 1/02* (2006.01)

(52) U.S. Cl.
CPC .............. *H01B 7/0823* (2013.01); *H01P 5/12* (2013.01); *H01R 12/727* (2013.01); *H05K 1/0245* (2013.01); *H05K 1/14* (2013.01); *H05K 1/142* (2013.01); *H05K 1/147* (2013.01); *H05K 3/308* (2013.01); *H05K 2201/10189* (2013.01)

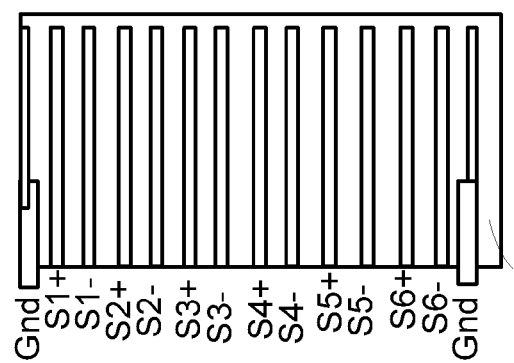
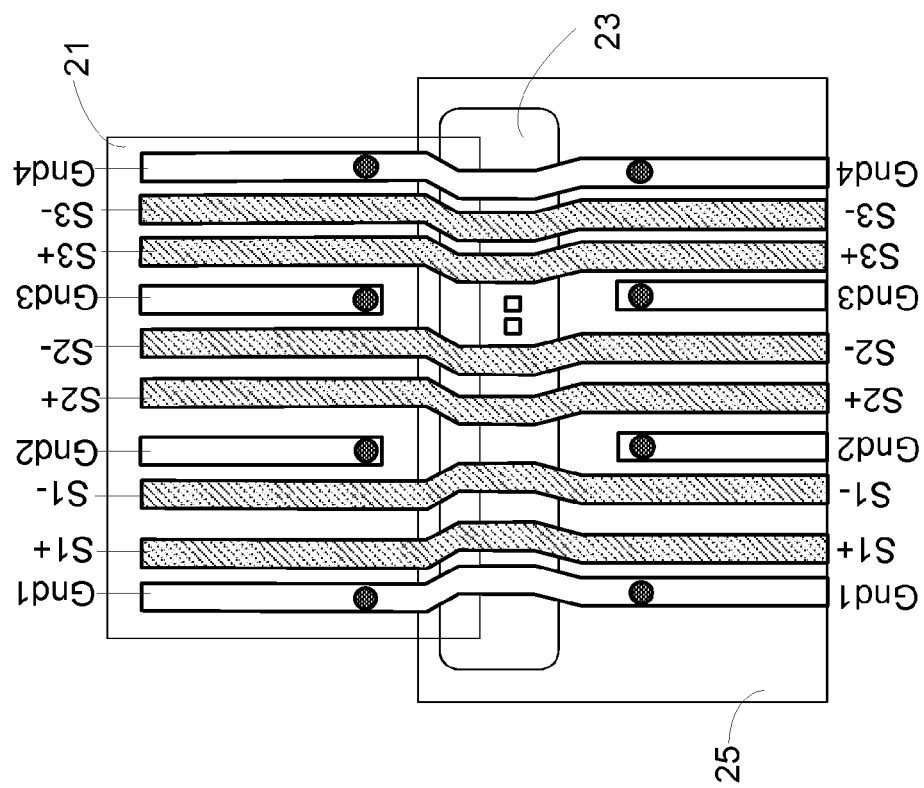

|  | | resolution (pixels) | | | |
|---|---|---|---|---|---|
|  | | WVGA (400*800) | HD720 (720*1280) | FHD (1080*1920) | WQXGA (1600*2560) |
|  | connector pin count configuration | 1 port*1 lane | 1 port*2 lane | 1 port*4 lane | 2 port*4 lane |
| conventional | data signal | 2 | 4 | 8 | 16 |
|  | clock signal | 2 | 2 | 2 | 4 |
|  | shield line | 3 | 4 | 6 | 12 |
|  | total number | 7 | 10 | 16 | 32 |
| present invention | shield line | 2 | 2 | 2 | 2 |
|  | total number | 6 | 8 | 12 | 22 |

LAYOUT METHOD, ELECTRONIC DEVICE AND CONNECTOR

This application claims the benefit of Taiwan application Serial No. 102134351, filed Sep. 24, 2013, the subject matter of which is incorporated herein by reference.

BACKGROUND OF THE INVENTION

Field of the Invention

The invention relates in general to a layout method, an electronic device and a connector, and more particularly to a layout method, an electronic device and a connector with pairs of differential lines.

Description of the Related Art

Many portable devices provide display device to display video data. The Mobile Industry Processor Interface (hereinafter, MIPI) that transmits control signals by differential means is a transmission interface commonly applied to control a display panel.

FIG. 1A shows a schematic diagram of a display device based on MIPI. A display device 11 includes a display panel 11a and a display driver chip 11b. The display panel 11a is controlled by the display driver chip 11b.

The display driver chip 11b receives signals via 19 conductive lines of a flexible printed circuit (hereinafter, FPC). These 19 conductive lines include ten differential lines, six ground shield lines (Gnd) and three control lines. It is assumed in FIG. 1A that, the ten differential lines are for transmitting four pairs of differential data signals (D0±, D1±, D2± and D3±), and one pair of differential clock signals (CLK±).

FIG. 1B shows a schematic diagram of an FPC. An FPC 13 has two connecting sides. The left connecting side is electrically connected to a display driver chip, and the right connecting side is electrically connector to a connector (not shown).

The connector is mounted on a printed circuit board (hereinafter, PCB) of a host end, and serves as a medium that transmits signals between the FPC 13 and the PCB. For example, the host end may be a main circuit of a cell phone or a portable DVD playback circuit.

The above combination of the FPC, the connector and the PCB is applied to various kinds of portable devices that support display functions. To allow the display device 11 to receive control signals from the host end, the same number of conducting wires are disposed at the FPC 13, the connector and the PCB.

The bandwidth required by MIPI gets larger as the resolution of a panel gets higher, and the number of differential line pairs required also increases. Further, the number of conductive lines (pins) involved in the connector utilized also increases as the number of differential line pairs increases, in a way that the occupied by the connector on the PCB expands as well. However, such occurrence of the increased pin count and the expanded hardware space is an issue that manufacturers of portable devices hope to avoid.

SUMMARY OF THE INVENTION

According to a first aspect of the present invention, a layout method applied to a connector is provided. The connector connects between a flexible printed circuit (FPC) and a printed circuit board (PCB). The FPC includes M pairs of differential lines and X shield lines. The PCB includes M pairs of differential lines and Z shield lines. The layout method includes following steps. Firstly, M pairs of conductive lines are disposed on the connector. The M pairs of conductive lines are correspondingly electrically connected to the M pairs of differential lines of the FPC and the M pairs of differential lines of the PCB, Then, Y shield lines are disposed on the connector, wherein Y is smaller than X. At least one of the Y shield lines is electrically connected to at least one of the X shield lines and at least one of the Z shield lines.

According to a second aspect of the present invention, an electronic device is provided. The electronic device includes an FPC, a PCB and a connector. The FPC includes M pairs of differential lines and X shield lines. The PCB includes M pairs of differential lines and Z shield lines. The connector includes: M pairs of conductive lines and Y shield lines, wherein Y is smaller than X. The M pairs of conductive lines are correspondingly electrically connected to the M pairs of differential lines of the FPC and the M pairs of differential lines of the PCB. At least one of the Y shield lines is electrically connected to at least one of the X shield lines and at least one of the Z shield lines.

According to a third aspect of the present invention, a connector is provided. The connector is electrically connected between an FPC and a PCB. The FPC includes M pairs of differential lines and X shield lines. The PCB includes M pairs of differential lines and Z shield lines. The connector includes: M pairs of conductive lines and Y shield lines. The M pairs of conductive lines are correspondingly electrically connected to the M pairs of differential lines of the FPC and the M pairs of differential lines of the PCB. At least one of the Y shield lines is electrically connected to at least one of the X shield lines and at least one of the Z shield lines. In addition, Y is smaller than X.

The above and other aspects of the invention will become better understood with regard to the following detailed description of the preferred but non-limiting embodiments. The following description is made with reference to the accompanying drawings.

BRIEF DESCRIPTION OF THE DRAWINGS

FIG. 2 is a schematic diagram of a connector adopting a layout method of the present invention;

FIG. 3 is a schematic diagram of a conventional connector with six pairs of differential lines;

FIG. 4 is a schematic diagram of a connector with six pairs of differential lines according to an embodiment of the present invention;

DETAILED DESCRIPTION OF THE INVENTION

Figure 1A:
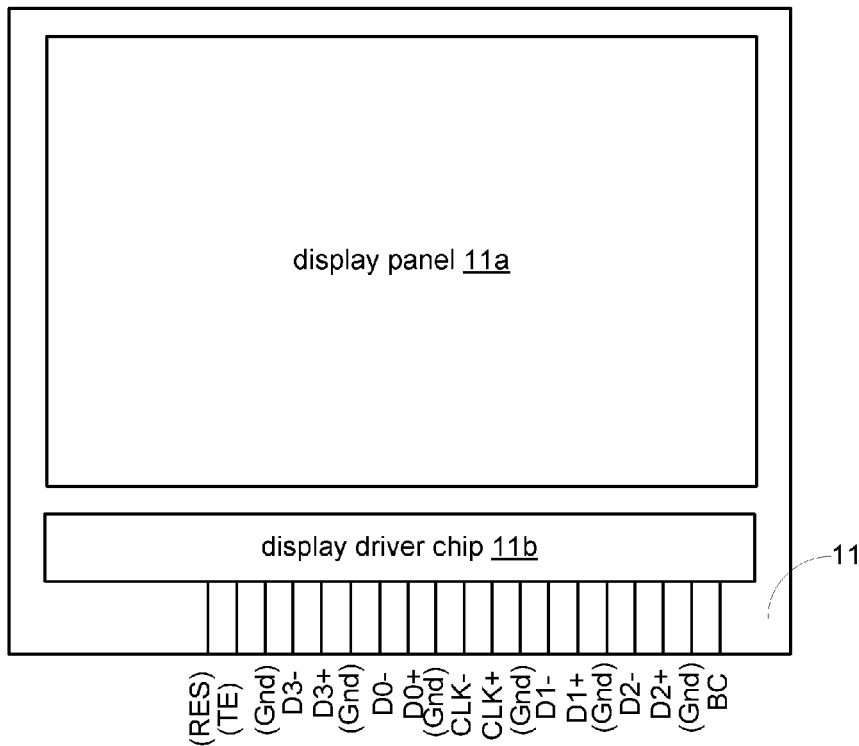
FIG. 1A (prior art) is a schematic diagram of a display controlled according to MIPI.
Figure 1B:
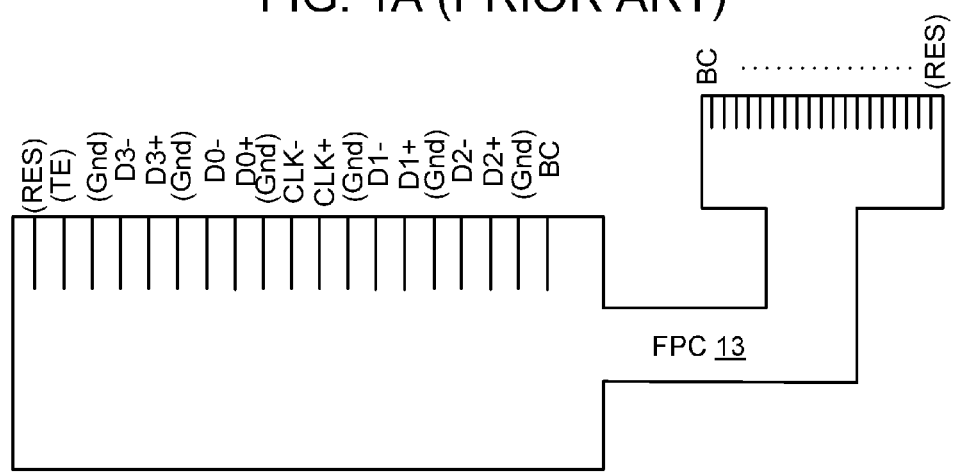
FIG. 1B (prior art) is a schematic diagram of an FPC.

To better illustrate the layout of conductive lines of an FPC, a connector and a PCB, it is assumed that M represents the number of pairs of differential lines, X represents number of shield lines of the FPC, Y represents that of the connector, and Z represents that of the PCB.

In the embodiments below, it is assumed that a shield line is a grounded shield line (Gnd) having a voltage at a ground level. In other applications, voltage of the shield lines may be a stable voltage level.

In the embodiments below, it is further assumed that two of conductive lines provided by the connector are shield lines (Y=2). In practice, the number of shield lines (Y) provided by the connector only needs to satisfy the relationship of Y<X. It should be noted that, the embodiments of the present invention focus at the number of shield lines provided by the connector. The numbers of pairs of differential lines and control lines may be differently determined according to applications or specifications.

Assume that the FPC and the PCB include ten conductive lines, respectively. The ten conductive lines include three pairs of differential lines and four shield lines for transmitting signals. That is, in the embodiment, M=3 and X=Z=4.

FIG. 2 shows a connector applied with a layout method according to an embodiment of the present invention. In the embodiment, the connector is disposed with M pairs of conductive lines (differential data lines and/or differential clock lines) (M=3), and Y shield lines (Y=2). Both differential data lines (Dx) and differential clock lines (CLK) are represented by Sx±.

From left to right, the conductive lines on an FPC 21 are sequentially a first shield line Gnd1, a first positive differential line S1+, a first negative differential line S1−, a second shield line Gnd2, a second positive differential line S2+, a second negative differential line S2−, a third shield line Gnd3, a third positive differential line S3+, a third negative differential line S3−, and a fourth shield line Gnd4. The second shield line Gn2 and the third shield line Gnd3 are not connected to a connector 23.

In the embodiment, each of the shield lines (Gnd1, Gnd2, Gnd3 and Gnd4) of the FPC 21 has a dot at a position near the connector 23. These dots indicate that the shield lines of the FPC 21 are conducted to a ground layer. The first shield line Gnd1 and the fourth shield line Gnd4 of the FPC 21 are respectively further connected to the leftmost and the rightmost conductive lines of the connector 23. The second shield line Gnd2 and the third shield line Gnd3 of the FPC 21 are not connected to the connector 23.

From left to right, the conductive lines of the PCB 25 are sequentially a first shield line Gnd1, a first positive differential line S1+, a first negative differential line S1−, a second shield line Gnd2, a second positive differential line S2+, a second negative differential line S2−, a third shield line Gnd3, a third positive differential line S3+, a third negative differential line S3−, and a fourth shield line Gnd4. The second and the third shield lines Gnd2, Gnd3 are not connected to the connector 23.

At positions near the connector 23, the second shield line Gnd2 and the third shield line Gnd3 of the PCB 25 are directly connected to a ground layer of the PCB 25. The first shield line Gnd1 and the fourth shield lines Gnd4 of the PCB 25 are respectively connected to the leftmost and the rightmost conductive lines of the connector 23. Further, at positions near the connector 23, the first and the third shield lines Gnd1, Gnd3 of the PCB 25 are also connected to the ground layer of the PCB 25.

As previously mentioned, both the FPC 21 and the PCB 25 have a ground layer. The ground layer is connected to all of the shield lines (Gnd1, Gnd2, Gnd3 and Gnd4). However, only a part (a Y number of) the shield lines of the FPC 21 and the PCB 25 are selected to connect with the connector 23.

In other words, through three pairs of differential conductive lines of the connector 23, three pairs of differential lines of the FPC 21 are connected to three pairs of differential lines of the PCB 25. However, only two among the four shield lines of the FPC 21 are selected to be connected to the connector 23. These two selected shield lines are further connected to two among the four shield lines of the PCB 25.

In a configuration of M=3 and X=Z=4, a conventional connector requires ten conductive lines. That is, according to the prior art, an FPC, a PCB and a connector all have the same number of conductive lines. However, the connector 23 in the embodiment requires only eight conductive lines.

As seen from FIG. 2, when adopting such layout method, the connector 23 of the present invention utilizes two fewer conductive lines than the conventional solution. Therefore, a manufacturer may employ a connector having eight conductive lines instead of a connector having ten conductive lines. By employing a connector having a smaller number of conductive lines, cost of the connector is lowered, and the space occupied by the connector of the PCB may also be reduced.

In FIG. 2, the shield lines at the left and right sides of the FPC 21 and the PCB 25 are selected to be connected to the connector 23. In practice, the positions of the selected shield lines are not limited to the example above. For example, two shield lines at relatively inner positions (i.e., the second shield line Gnd2 and the third shield line Gn3d), or one shield line at an outer-side position and one shield line at a middle position (i.e., the first shield line Gnd1 and the third shield line Gnd3) may be selected.

Further, the number (Y) of the shield lines of the connector 23 needs to be smaller than the number (X) of the shield lines of the FPC 21 and the number (Z) of the shield lines of the PCB 25. As X=Z=4, it means that the number of the shield lines of the connector 23 is not necessarily two, and may be one or three (Y=1 or Y=3).

In practice, the FPC 21 used together with the connector 23 is not limited to a specific type. For example, the FPC 21 may be a single-sided FPC, a double-sided FPC, a multi-layer FPC, or a fine-line FPC.

FIG. 3 shows a schematic diagram of a conventional connector with six pairs of differential lines. A conventional connector 33, from top to bottom, includes a shield line Gnd, a first differential line pair S1±, a shield line Gnd, a second differential line pair S2±, a shield line Gnd, a third differential line pair S3±, a shield line Gnd, a fourth differential line pair S4±, a shield line Gnd, a fifth differential line pair S5±, a shield line Gnd, a sixth differential line pair S6±, and a shield line Gnd. Therefore, when M=6, the conventional connector 33 needs a total of 19 conductive lines (2*6+7=19).

FIG. 4 shows a schematic diagram of a connector with six pairs of differential lines according to an embodiment of the present invention. In the embodiment, it is assumed that a connector 43 provides two conductive lines as shield lines, which are located at two sides of the connector 43.

Referring to FIG. 4, from top to bottom, a connector 43 includes a shield line Gnd, a first differential line pair S1±, a second differential line pair S2±, a third differential line pair S3±, a fourth differential line pair S4±, a fifth differential line pair S5±, a sixth differential line pair S6±, and another shield line Gnd. Therefore, when M=6, the connector 43 of the present invention needs 2*6+2=14 conductive lines.

By comparing FIG. 3 and FIG. 4, when M=6, the arrangement of the embodiment saves 19−14=5 conductive lines. It is discovered from the foregoing description that, the number of conductive lines saved by the embodiment gets more noticeable as the value of M gets larger.

Figures 5, 6:
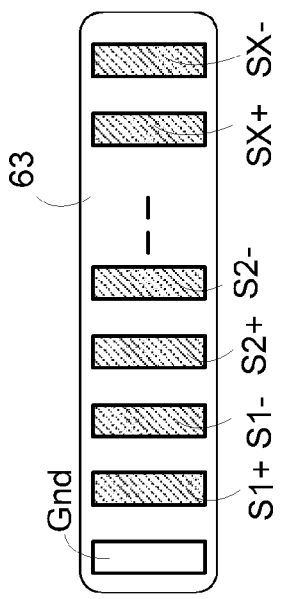
FIG. 5 is a comparison table of arrangements adopted by MIPI according to different resolutions of a display device.
FIG. 6 is a schematic diagram of a connector utilizing one shield line.

FIG. 5 shows a comparison table of arrangements adopted by MIPI according to different resolutions of a display device. The MIPI standard includes differential clock lines and differential data lines. The number of pairs of the differential clock lines is smaller that of the differential data lines.

It is assumed that a transmission rate of each lane formed by one MIPI data line pair is the fastest 1 Gbps (i.e., 1 Gbps per lane). The resolutions adopted by a display device, the number of pairs of differential clock lines and that of the data lines required for MIPI transmission are described below. Further, the numbers of conductive lines respectively required by the conventional connector and the connector of the embodiment are compared below.

According to a concept of the present invention, M represents the number of pairs of differential lines of the FPC, the connector and the PCB. Differential lines commonly refer to differential clock lines and differential data lines. Further, the numbers of shield lines of the FPC, the connector and the PCB are represented by X, Y and Z, respectively, and are correlated by a relationship of $1 \leq Y < X = Z$. For comparison purposes, it is assumed that $Y=2$, and FIG. 5 is illustrated from left to right.

The third column in FIG. 5 represents a situation where the standard of the display device is a WVGA (480*800) format. The WVGA format utilizes one pair of differential data lines, and one pair of differential clock lines. Thus, both the FPC and the PCB have two pairs of differential lines (M=2) and three shield lines (X=Z=3).

For a conventional connector, the numbers of conductive lines of the connector, the FPC, and the PCB are equal. Therefore, the conventional connector needs a total of seven conductive lines (2*2+3=7). In contrast, the connector according to the embodiment of the present invention needs only two shield lines (Y=2), meaning that a connector adopting the layout method of the embodiment only needs six conductive lines (M*2+Y=2*2+2=6). Further compared with the conventional connector, the connector of the embodiment saves one conductive line (7−6=1) when the resolution of the display device is the WVGA format.

The fourth column in FIG. 5 represents a situation where the resolution of the display device is an HD720 (720*1280) format. The HD720 format utilizes two pairs of differential data lines and one pair of differential clock lines. Thus, both the FPC and the PCB have three pairs of differential lines (M=3) and four shield lines (X=Z=4).

For a conventional connector, the numbers of conductive lines of the connector, the FPC and the PCB are equal. Therefore, the conventional connector needs a total of ten conductive lines (2*3+4=10). In contrast, the connector according to the embodiment of the present invention needs only two shield lines (Y=2), meaning that a connector adopting the layout method of the embodiment only needs eight conductive lines (M*2+Y=3*2+2=8). Further compared with the conventional connector, the connector of the embodiment saves two conductive lines (10−8=2) when the resolution of the display device is the HD720 format.

The fifth column in FIG. 5 represents a situation where the resolution of the display device is an FHD (1080*1920) format. The FHD format needs four pairs of differential data lines and one pair of differential clock lines. Thus, both the FPC and the PCB have five pairs of differential lines (M=5) and six shield lines (X=Z=6).

For a conventional connector, the numbers of conductive lines of the connector, the FPC, and the PCB are equal. Therefore, the conventional connector needs a total of 16 conductive lines (5*2+6=16). In contrast, the connector according to the embodiment of the present invention needs only two shield lines (Y=2), meaning that a connector adopting the layout method of the embodiment only needs to include 12 conductive lines (M*2+Y=5*2+2=12). Further compared with the conventional connector, the connector of the embodiment saves four conductive lines (16−12=4) when the resolution of the display device is the FHD format.

The sixth column in FIG. 5 represents a situation where the resolution of the display device is a WQXGA (1600*2560) format. The WQXGA already exceeds beyond the definition of the MIPI standard, and needs to be implemented by two MIPI ports. That is, eight pairs of differential data lines and two pairs of differential clock lines are required. Thus, both of the FPC and the PCB have ten pairs of differential lines (M=10) and twelve shield lines (X=Z=12).

For a conventional connector, the numbers of conductive lines of the connector, the FPC, and the PCB are equal. Therefore, the conventional connector needs a total of 32 conductive lines (10*2+12=32). In contrast, the connector according to the embodiment of the present invention needs only two shield lines (Y=2), meaning that a connector adopting the layout method of the embodiment only needs to include 22 conductive lines (M*2+Y=20*2+2=22). Further compared with the conventional connector, the connector of the embodiment saves ten conductive lines (32−22=10) when the resolution of the display device is the WQXGA format.

In continuation of the above description, the connector according to the embodiment of the present invention is capable of saving the number of conductive lines required regardless whether the resolution of the display device is a WVGA, HD720, FHD or WQXGA format. Therefore, an electronic device manufacturer may adopt the connector having a smaller number of conductive lines to reduce hardware costs.

In practice, the number and disposed positions of the shield lines are not limited. For example, in the embodiment in FIG. 6, only one shield line is provided.

FIG. 6 shows a schematic diagram of a connector with one shield line. This diagram illustrates that, regardless of the number of pairs of differential lines, the connector 63 may provide merely one shield line. Further, the actual position of the shield line Gnd is not limited to being at an outer side of the connector 63.

As experimentally proven, in a situation where the transmission effect of differential lines is maintained, the layout method of the present invention is capable of significantly reducing the number of conductive lines required by a connector. The layout method of the present invention is applicable to various kinds of connectors, e.g., zero insertion force (ZIF) connectors, multi-row insertion connectors, board-to-board connectors, hard-bar connectors, flip-lock type (or rotator cover) connectors, slide-type connectors, ZIF-type board to FPC connectors, surface mount (SMT) connectors, slide SMT connectors, and non-ZIF type board to FPC connectors etc.

With the description of the embodiments, a layout method for the connector is provided. The layout method is capable of significantly reducing a pin count that a MIPI I/F connector requires. Accordingly, hardware costs and mechanism sizes of cell phones using connectors can be effectively decreased. Further, according to experimental results, quality of MIPI transmission is assured when the pin configuration of such connector is used.

It should be noted that, the layout method and the design of the connector above may be further applied to other types of differential transmission standards. For example, the M pairs of differential lines may adopt the D-PHY standard, the M-PHY standard, the embedded DisplayPort (ePD) standard, the Low-Voltage Differential Signaling (LVDS) standard, or the mini-LVDS standard.

While the invention has been described by way of example and in terms of the preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electronic device applicable to a display device having a display driving integrated circuit, comprising:
    a flexible printed circuit (FPC), comprising:
        M pairs of differential lines; and
        X shield lines;
    a printed circuit board (PCB), comprising:
        M pairs of differential lines; and
        Z shield lines; and
    a connector, comprising:
        M pairs of conductive lines, for correspondingly connecting the M pairs of differential lines of the FPC to the M pairs of differential lines of the PCB; and
        Y shield lines, at least one of which is placed on at least one outer side of the connector and connected to at least one of the X shield lines and at least one of the Z shield lines, where a total number of the at least one of the Y shield lines is less than 3 and Y is smaller than X.

2. The electronic device according to claim 1, wherein X is equal to Z.

3. The electronic device according to claim 1, wherein the M pairs of differential lines comprise at least one pair of differential clock lines and a plurality of pairs of differential data lines.

4. The electronic device according to claim 1, wherein a voltage level of the shield line is a ground level or a stable voltage.

5. The electronic device according to claim 1, wherein the FPC is a single-sided FPC, a double-sided FPC, a multi-layer FPC or a fine-line FPC.

6. The electronic device according to claim 1, wherein the connector is a zero insertion force (ZIF) connector, a multi-row insertion connector, a board-to-board connector, a hard-bar connector, a flip-lock type connector, a slide-type connector, a ZIF-type board to FPC connector, a surface mount (SMT) connector, a slide SMT connector, or a non-ZIF type board to FPC connector.

7. A connector applicable to a display device having a display driving integrated circuit, electrically connected between a flexible printed circuit (FPC) and a printed circuit board (PCB), wherein the FPC comprises M pairs of differential lines and X shield lines, and the PCB comprises M pairs of differential lines and Z shield lines, the connector comprising:
    M pairs of conductive lines, correspondingly electrically connected to the M pairs of differential lines of the FPC and the M pairs of differential lines of the PCB; and
    Y shield lines, at least one of which is placed on at least one outer side of the connector and connected to at least one of the X shield lines and at least one of the Z shield lines, wherein a total number of the at least one of the Y shield lines is less than 3 and Y is smaller than X.

8. The connector according to claim 7, wherein the connector is a zero insertion force (ZIF) connector, a multi-row insertion connector, a board-to-board connector, a hard-bar connector, a flip-lock type connector, a slide-type connector, a ZIF-type board to FPC connector, a surface mount (SMT) connector, a slide SMT connector, or a non-ZIF type board to FPC connector.

* * * * *